United States Patent
Ikemura et al.

(10) Patent No.: US 12,421,259 B2
(45) Date of Patent: Sep. 23, 2025

(54) TITANIUM COMPLEX, METHOD FOR PRODUCING SAME, AND METHOD FOR PRODUCING TITANIUM-CONTAINING THIN FILM

(71) Applicant: TOSOH CORPORATION, Yamaguchi (JP)

(72) Inventors: Shuya Ikemura, Ayase (JP); Hiroyuki Oike, Ayase (JP); Yuki Yamamoto, Ayase (JP); Teppei Hayakawa, Ayase (JP)

(73) Assignee: TOSOH CORPORATION, Yamaguchi (JP)

( * ) Notice: Subject to any disclaimer, the term of this patent is extended or adjusted under 35 U.S.C. 154(b) by 504 days.

(21) Appl. No.: 18/014,419

(22) PCT Filed: Jul. 8, 2021

(86) PCT No.: PCT/JP2021/025724
§ 371 (c)(1),
(2) Date: Jan. 4, 2023

(87) PCT Pub. No.: WO2022/009945
PCT Pub. Date: Jan. 13, 2022

(65) Prior Publication Data
US 2023/0257404 A1    Aug. 17, 2023

(30) Foreign Application Priority Data
Jul. 8, 2020    (JP) ................. 2020-117772

(51) Int. Cl.
*C07F 7/28* (2006.01)
*C01B 21/076* (2006.01)
*C23C 16/34* (2006.01)
*H01L 21/285* (2006.01)

(52) U.S. Cl.
CPC ............ *C07F 7/28* (2013.01); *C01B 21/0766* (2013.01); *C23C 16/34* (2013.01); *H01L 21/28568* (2013.01)

(58) Field of Classification Search
CPC .................... C07F 7/28; C23C 16/34
See application file for complete search history.

(56) References Cited

FOREIGN PATENT DOCUMENTS

| | | |
|---|---|---|
| JP | 2020-516764 | 6/2020 |
| JP | 2020-524905 | 8/2020 |
| WO | 2018/122603 | 7/2018 |
| WO | 2019/005433 | 1/2019 |

OTHER PUBLICATIONS

C.H. Winter, et al., 18(7) Organometallics, 1168-1176 (1999) ("Winter") (Year: 1999).*
International Search Report for PCT/JP2021/025724 mailed Sep. 7, 2021, 5 pages.
Written Opinion of the ISA for PCT/JP2021/025724, mailed Sep. 7, 2021, 3 pages.
Pfeiffer et al., "Synthesis, Structure, and Molecular Orbital Studies of Yttrium, Erbium and Lutetium Complexes Bearing η 2-Pyrazolato Ligands: Development of a New Claims of Precursors for Doping Semiconductors", Inorganic Chemistry, 1999, vol. 38, pp. 4539-4548.
Yélamos et al., "Imido Complexes of Titanium Bearing è2-Pyrazolato Ancillary Ligand Sets", Organometallics, vol. 18, p. 1168-1176 (1999).
Yélamos et al., "Synthesis, Structure, and Properties of Group 4 and 5 Metal Pyrazolato Chloride Complexes", Inorganic Chemistry, vol. 38, p. 1871-1878 (1999).
Yélamos et al., "Early Transition Metal Complexes Containing 1,2,4-Triazolato and Tetrazolato Ligands: Synthesis, Structure, and Molecular Orbital Studies", Inorganic Chemistry, vol. 40, p. 6451-6462, (2001).

* cited by examiner

*Primary Examiner* — Alexander R Pagano
*Assistant Examiner* — Frank S. Hou
(74) *Attorney, Agent, or Firm* — NIXON & VANDERHYE, PC

(57) ABSTRACT

A titanium complex useful for producing a titanium-containing thin film under low temperature deposition conditions without using an oxidative gas is provided. A titanium complex represented by the general formula (1) (wherein each of $R_1$ and $R_2$ is independently a $C_{1-6}$ alkyl group which may be bonded with each other to form a ring, X is $CR_3$ or a N atom, Y is $CR_4$ or a N atom, Z is $CR_5$ or a N atom, each of $R_3$, $R_4$ and $R_5$ is independently a hydrogen atom or a $C_{1-6}$ alkyl group, and n is an integer of from 1 to 3).

9 Claims, 3 Drawing Sheets

TITANIUM COMPLEX, METHOD FOR PRODUCING SAME, AND METHOD FOR PRODUCING TITANIUM-CONTAINING THIN FILM

This application is the U.S. national phase of International Application No. PCT/JP2021/025724 filed Jul. 8, 2021, which designated the U.S. and claims priority to JP Patent Application No. 2020-117772 filed Jul. 8, 2020, the entire contents of each of which are hereby incorporated by reference.

TECHNICAL FIELD

The present invention relates to a titanium complex which is a material useful for manufacturing semiconductor devices, a method for producing it and a method for producing a titanium-containing thin film using the titanium complex as a precursor.

BACKGROUND ART

At present, in semiconductor manufacture, thin films used as interconnect barriers, capacitor dielectrics and electrodes are primarily formed by a physical vapor deposition (PVD) method called sputtering. However, the PVD method has difficulty in forming uniform thin films on uneven surfaces and hence is inappropriate for manufacture of future generations of semiconductors which requires formation of conformal thin films on the complex three-dimensional surface of miniaturized devices. Therefore, a film deposition method involving decomposition of the precursor gas, called chemical vapor deposition (CVD), and a film deposition method involving adsorption of the precursor onto the surface of the substrate followed by decomposition of the precursor, called atomic layer deposition (ALD), have been studied for formation of thin films. Formation of conformal thin films with good continuity requires film deposition at low temperatures (200° C.).

For forming thin films by CVD or ALD, precursors with adequate vapor pressure and thermal stability which can be vaporized and fed at a constant rate are chosen. For steady vaporization and feed at a constant rate, liquid precursors are preferred.

Titanium, titanium nitride and silicon-containing titanium nitride are promising as materials for capacitor electrodes, transistor gate electrodes and barrier layers for copper interconnects in semiconductor devices of future generations. Oxidation of these titanium-containing thin films leads to a resistivity increase which causes problems such as transistor circuit failures.

Non-Patent Document 1 discloses dimethylbis(3,5-di-tert-butylpyrazolato)titanium, and isopropylimidobis(3,5-di-tert-butylpyrazolato)(pyridine)titanium, which are structurally similar to the titanium complex of the present invention represented by the general formula (1) (hereinafter referred to as a titanium complex (1)) in that they have a pyrazolato ligand, but are different from the titanium complex of the present invention in that they have an alkyl or imido ligand. This document does not mention use of these titanium complexes as precursors in CVD or ALD.

Non-Patent Document 2 discloses trichloro(3,5-di-tert-butylpyrazolato)titanium and tetrakis(3,5-dimethylpyrazolato)titanium, which are structurally similar to the titanium complex (1) of the present invention but are different from the titanium complex of the present invention in that they have chloro ligands or four pyrazolato ligands. This document does not mention use of these titanium complexes as precursors in CVD or ALD.

Non-Patent Document 3 discloses tris(3,5-di-tert-butylpyrazolato)(3,5-dimethyl-1,2,4-triazolato)titanium and other titanium complexes, which are different from the titanium complex of the present invention in that they have four nitrogen-containing heterocyclic ligands. This document does not mention use of these titanium complexes as precursors in CVD or ALD.

Thus, there is demand for materials which allow deposition of titanium-containing thin films at low temperatures without using an oxidative gas such as oxygen and ozone as a reactant gas.

PRIOR ART DOCUMENTS

Non-Patent Documents

Non-Patent Document 1: Organometallics, vol. 18, p. 1168 (1999)
Non-Patent Document 2: Inorganic Chemistry, vol. 38, p. 1871 (1999)
Non-Patent Document 3: Inorganic Chemistry, vol. 40, p. 6451 (2001)

DISCLOSURE OF INVENTION

Technical Problem

The object of the present invention is to provide a titanium complex useful for forming titanium-containing thin films at low temperatures without using an oxidative gas.

Solution to Problem

As a result of their extensive research to solve the above-mentioned problem, the present inventors have found that titanium complexes represented by the general formula (1) are useful as a precursor for deposition of titanium-containing thin films at low temperatures without using an oxidative gas, especially at low temperatures using a reductive gas and has accomplished the present invention.

Namely, the present invention covers the following aspects.

[1] A titanium complex represented by the general formula (1):

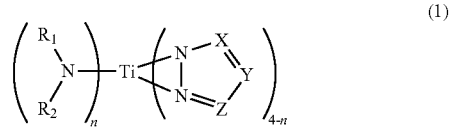

(wherein each of $R_1$ and $R_2$ is independently a $C_{1-6}$ alkyl group which may be bonded with each other to form a ring, X is $CR_3$ or a N atom, Y is $CR_4$ or a N atom, Z is $CR_5$ or a N atom, each of $R_3$, $R_4$ and $R_5$ is independently a hydrogen atom or a $C_{1-6}$ alkyl group, and n is an integer of from 1 to 3).

[2] The titanium complex according to [1], wherein each of $R_1$ and $R_2$ is independently a $C_{1-4}$ alkyl group, each of $R_3$, $R_4$ and $R_5$ is independently a hydrogen atom or a $C_{1-4}$ alkyl group, and n is 2 or 3.

[3] The titanium complex according to [1] or [2], wherein each of $R_1$ and $R_2$ is independently a methyl group or an ethyl group, each of $R_3$, $R_4$ and $R_5$ is independently a hydrogen atom or a methyl group, and n is 3.

[4] A method for producing the titanium complex as defined in any one of [1] to [3], which comprises reacting an amide complex represented by the general formula (2):

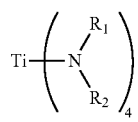
(2)

(wherein each of $R_1$ and $R_2$ is independently a $C_{1-6}$ alkyl group which may be bonded with each other to form a ring) with an unsaturated cyclic amine represented by the general formula (3):

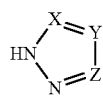
(3)

(wherein X is $CR_3$ or a N atom, Y is $CR_4$ or a N atom, Z is $CR_5$ or a N atom, each of $R_3$, $R_4$ and $R_5$ is independently a hydrogen atom or a $C_{1-6}$ alkyl group).

[5] A method for producing a titanium-containing thin film, which is characterized in that a titanium complex represented by the general formula (1):

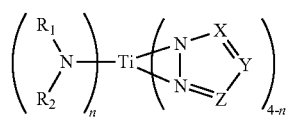
(1)

(wherein each of $R_1$ and $R_2$ is independently a $C_{1-6}$ alkyl group which may be bonded with each other to form a ring, X is $CR_3$ or a N atom, Y is $CR_4$ or a N atom, Z is $CR_5$ or a N atom, each of $R_3$, $R_4$ and $R_5$ is independently a hydrogen atom or a $C_{1-6}$ alkyl group, and n is an integer of from 1 to 3) is used in vapor deposition involving a chemical reaction.

[6] The method for producing a titanium-containing thin film according to [5], wherein the vapor deposition involving a chemical reaction is chemical vapor deposition.

[7] The method for producing a titanium-containing thin film according to [5] or [6], wherein a reactant gas is used in the vapor deposition involving a chemical reaction.

[8] The method for producing a titanium-containing thin film according to [7], wherein a reductive gas is used as the reactant gas.

[9] The method for producing a titanium-containing thin film according to any one of [5] to [8], wherein the titanium-containing thin film is a titanium nitride thin film.

Advantageous Effects of Invention

It is possible to produce a titanium-containing thin film at low temperatures without using an oxidative gas by using the titanium complex (1) of the present invention as a precursor.

DESCRIPTION OF EMBODIMENTS

Figure 1:
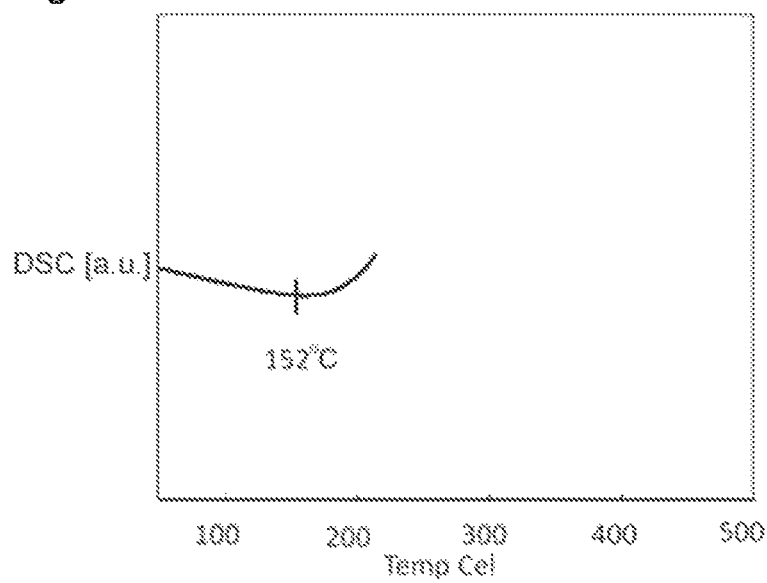
FIG. 1 A DSC chart of tris(dimethylamido)(3,5-dimethylpyrazolato)titanium (1-8) in Evaluation Example 1.

Now the present invention will be described in detail. First of all, X, Y and Z in the general formula (1) are preferably $CR_3$, $CR_4$ and $CR_5$, respectively in order for the titanium complex (1) of the present invention to have adequate vapor pressure and thermal stability as a precursor for deposition of thin films by CVD or ALD (hereinafter referred to as a CVD or ALD precursor).

Next, the definitions of $R_1$, $R_2$, $R_3$, $R_4$ and $R_5$ will be explained. A $C_{1-6}$ alkyl group as $R_1$, $R_2$, $R_3$, $R_4$ and $R_5$ may be linear, branched or cyclic, and may, for example, be a methyl group, an ethyl group, a propyl group, an isopropyl group, a cyclopropyl group, a butyl group, an isobutyl group, a sec-butyl group, a tert-butyl group, a cyclobutyl group, a pentyl group, a 1-ethylpropyl group, a 1-methylbutyl group, a 2-methylbutyl group, an isopentyl group, a neopentyl group, a tert-pentyl group, a cyclopentyl group, a cyclobutylmethyl group, a hexyl group, a 1-methylpentyl group, a 2-methylpentyl group, a 3-methylpentyl group, a 4-methylpentyl group, a 1,1-dimethylbutyl group, a 1,2-dimethylbutyl group, a 1,3-dimethylbutyl group, a 2,2-dimethylbutyl group, a 2,3-dimethylbutyl group, a 3,3-dimethylbutyl group, a cyclohexyl group, a cyclopentylmethyl group, a 1-cyclobutylethyl group or a 2-cyclobutylethyl group. The group formed by $C_{1-6}$ alkyl groups as $R_1$ and $R_2$ which are bonded with each other to form a ring may be linear or branched, and may, for example, be a 1,2-ethylene group, a 1-methyl-1,2-ethylene group, a 1,1-dimethyl-1,2-ethylene group, a 1,2-dimethyl-1,2-ethylene group, a 1,3-trimethylene group, a 1-methyl-1,3-trimethylene group, a 2-methyl-1,3-trimethylene group, a 1,1-dimethyl-1,3-trimethylene group, a 1,2-dimethyl-1,3-trimethylene group, a 1,3-dimethyl-1,3-trimethylene group, a 2,2-dimethyl-1,3-trimethylene group, a 1,4-tetramethylene group, a 1-methyl-1,4-tetramethylene group, a 2-methyl-1,4-tetramethylene group, a 1,5-pentamethylene group, a 1-methyl-1,5-pentamethylene group, a 2-methyl-1,5-pentamethylene group, a 3-methyl-1,5-pentamethylene group, a 1,6-hexamethylene group, a 1-methyl-1,6-hexamethylene group, a 2-methyl-1,6-hexamethylene group or a 3-methyl-1,6-hexamethylene group. It is preferred that each of $R_1$ and $R_2$ is independently a $C_{1-4}$ alkyl group, preferably a methyl group or an ethyl group, in order for the titanium complex (1) of the present invention to have adequate vapor pressure and thermal stability as a CVD or ALD precursor. It is preferred that each of $R_3$, $R_4$ and $R_5$ is independently a hydrogen atom or a $C_{1-4}$ alkyl group, preferably a hydrogen atom or a methyl group, in order for the titanium complex (1) of the present invention to have adequate vapor pressure and thermal stability as a CVD or ALD precursor.

Next, the definition of n in the general formula (1) will be explained. n is an integer of from 1 to 3, and is preferably 2 or 3, particularly preferably 3 in order for the titanium complex (1) of the present invention to have adequate vapor pressure and thermal stability as a CVD or ALD precursor.

The pyrazolato ligand in the titanium complex (1) of the present invention can coordinate both in an $\eta^1$-coordination mode and in an $\eta^2$-coordination mode as shown below, but herein the ligand is represented in an $\eta^2$-coordination mode.

$\eta^1$-coordination

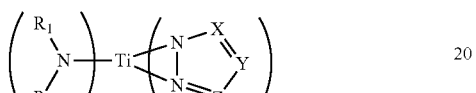

$\eta^2$-coordination (wherein $R_1$, $R_2$, X, Y, Z and n are the same as previously defined.)

As specific examples of the titanium complex (1) of the present invention, (1-1)
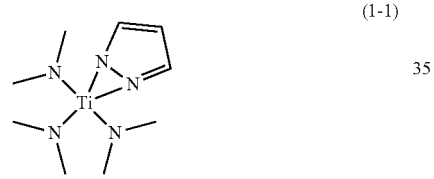

(1-2)
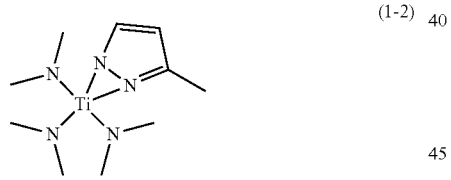

(1-3)
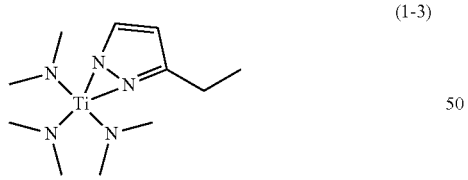

(1-4)
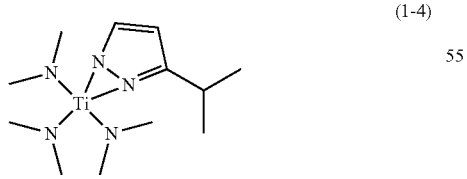

(1-5)
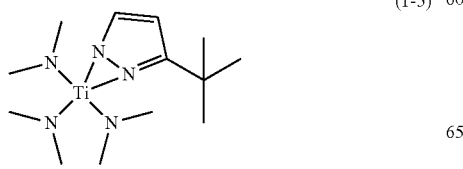

(1-6)
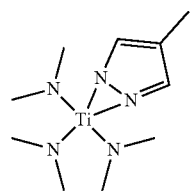

(1-7)
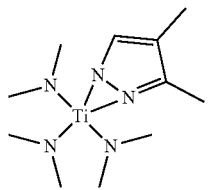

(1-8)
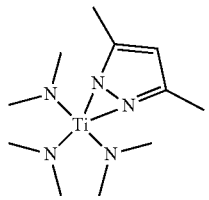

(1-9)
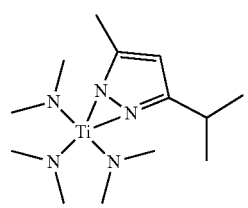

(1-10)
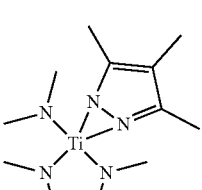

(1-11)
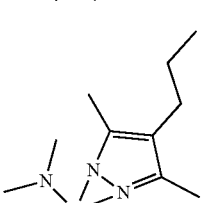

(1-12)
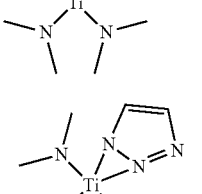

(1-13)
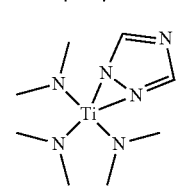

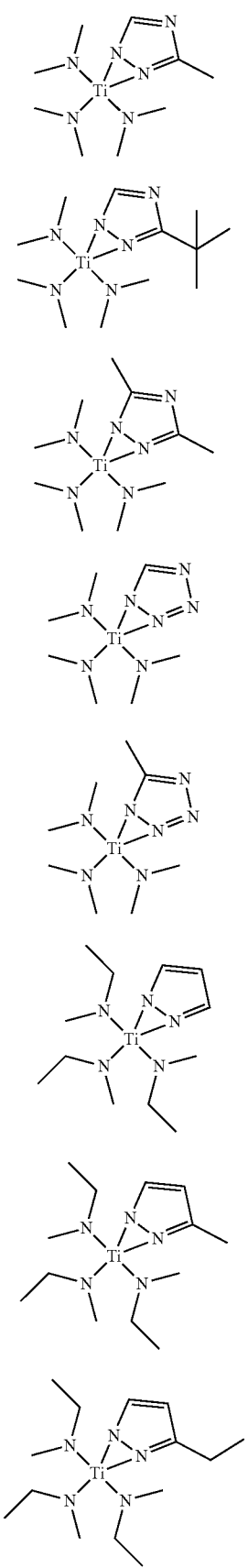
(1-14)
(1-15)
(1-16)
(1-17)
(1-18)
(1-19)
(1-20)
(1-21)
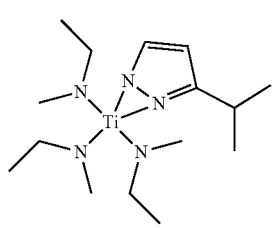
(1-22)
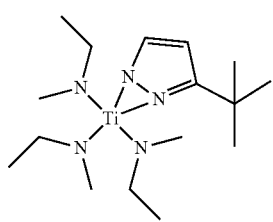
(1-23)
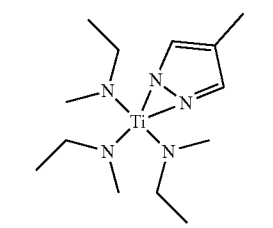
(1-24)
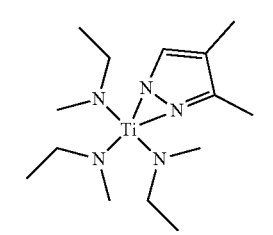
(1-25)
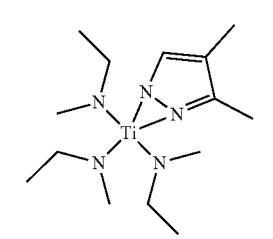
(1-26)
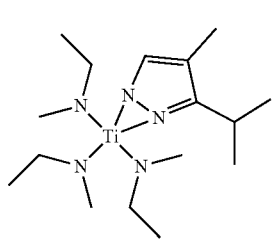
(1-27)
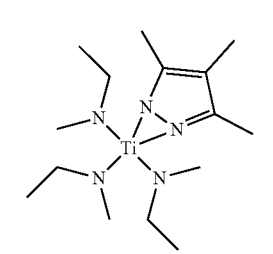
(1-28)

(1-29)
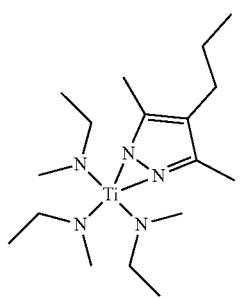
(1-30)
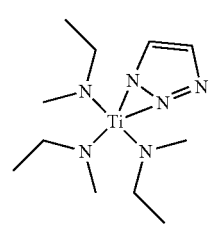
(1-31)
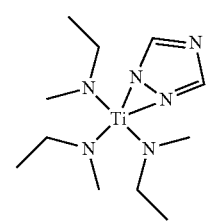
(1-32)
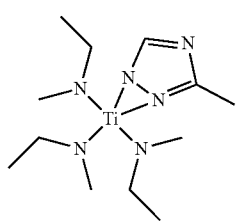
(1-33)
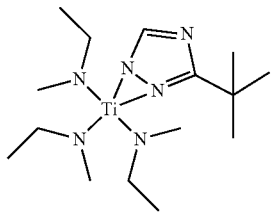
(1-34)
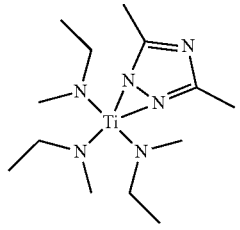
(1-35)
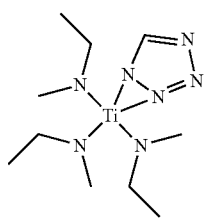
(1-36)
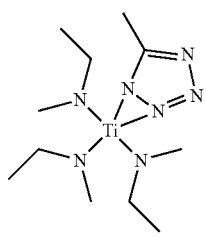
(1-37)
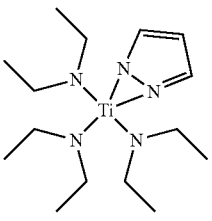
(1-38)
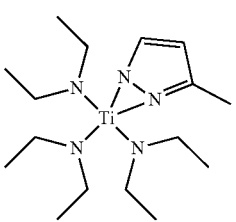
(1-39)
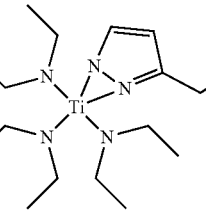
(1-40)
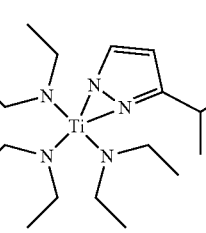
(1-41)
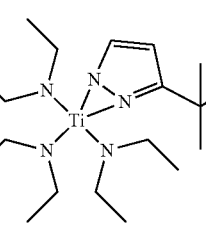

(1-42)
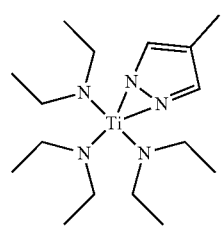
(1-43)
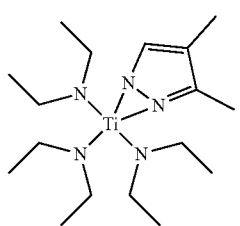
(1-44)
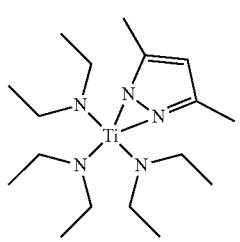
(1-45)
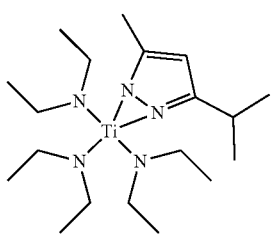
(1-46)
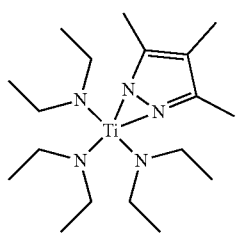
(1-47)
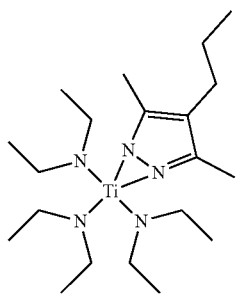
(1-48)
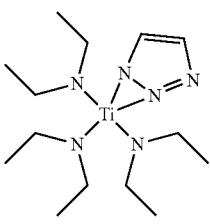
(1-49)
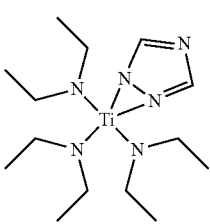
(1-50)
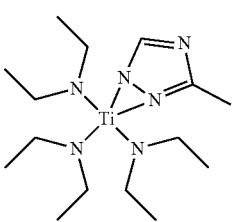
(1-51)
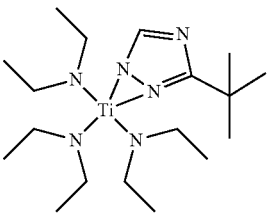
(1-52)
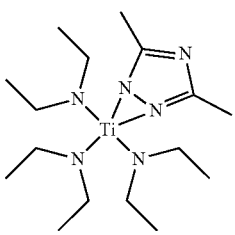
(1-53)
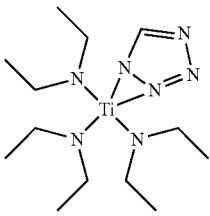
(1-54)
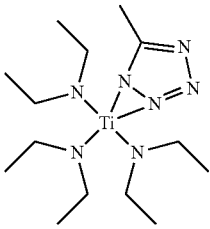

-continued
(1-55)
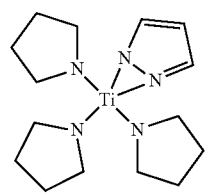
(1-56)
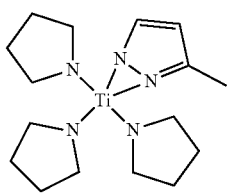
(1-57)
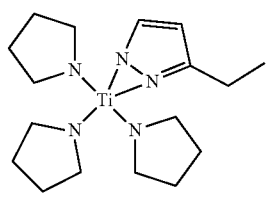
(1-58)
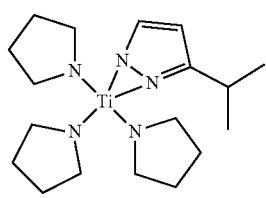
(1-59)
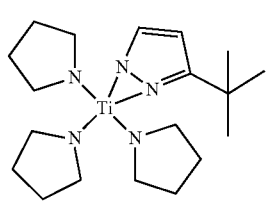
(1-60)
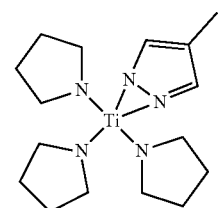
(1-61)
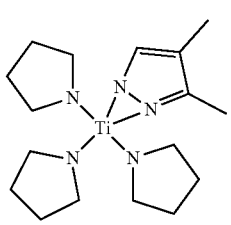
-continued
(1-62)
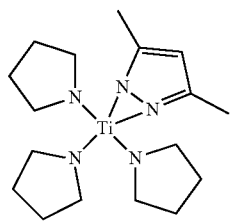
(1-63)
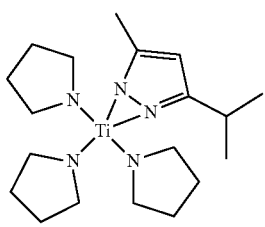
(1-64)
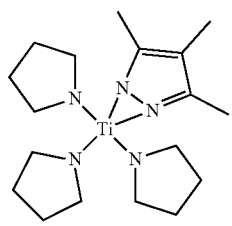
(1-65)
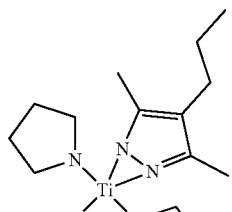
(1-66)
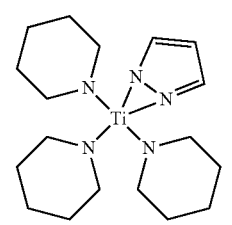
(1-67)
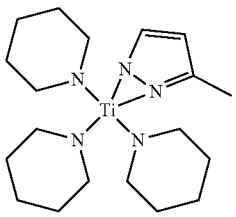
(1-68)
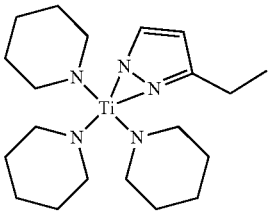

-continued
(1-69)
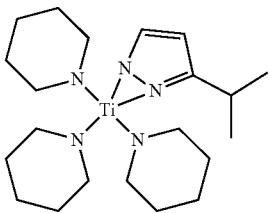
(1-70)
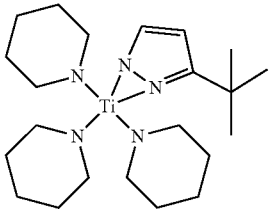
(1-71)
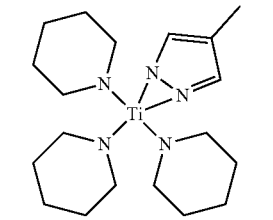
(1-72)
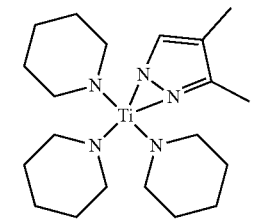
(1-73)
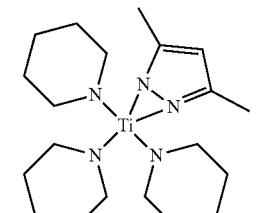
(1-74)
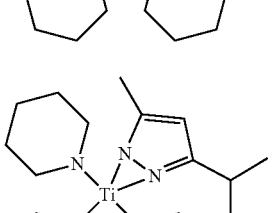
(1-75)
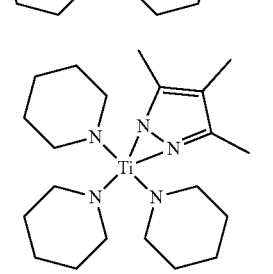
-continued
(1-76)
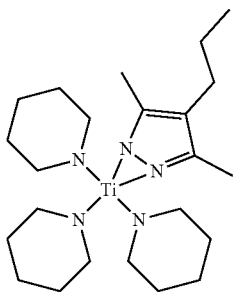
(1-77)
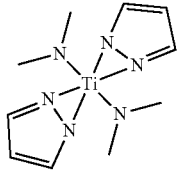
(1-78)
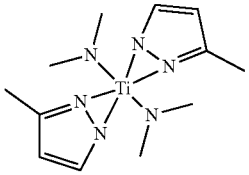
(1-79)
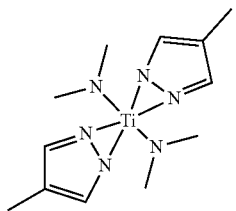
(1-80)
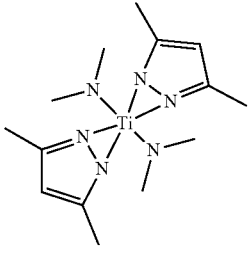
(1-81)
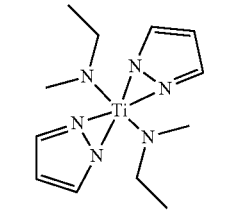
(1-82)
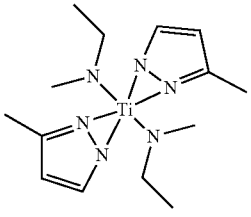

(1-83)
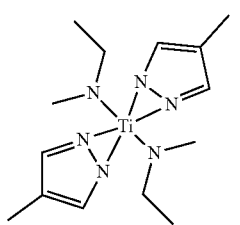
(1-84)
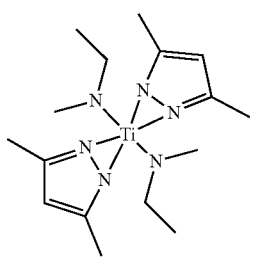
(1-85)
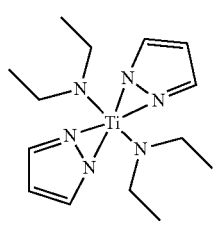
(1-86)
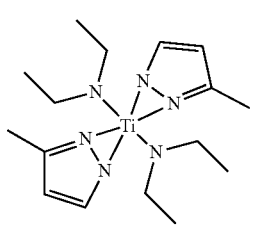
(1-87)
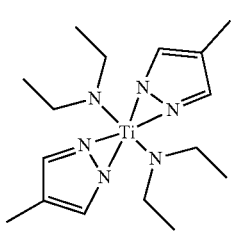
(1-88)
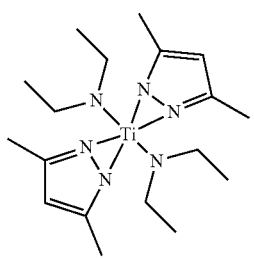
(1-89)
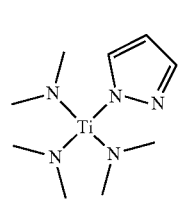
(1-90)
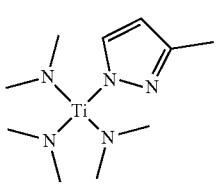
(1-91)
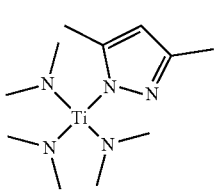
(1-92)
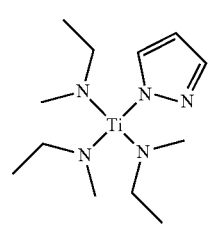
(1-93)
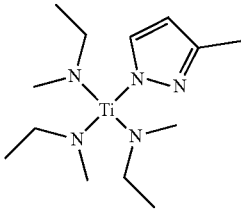
(1-94)
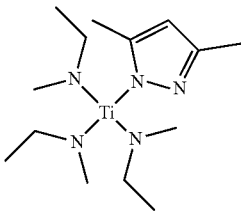
(1-95)
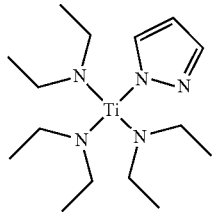
(1-96)
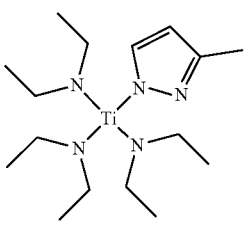

-continued

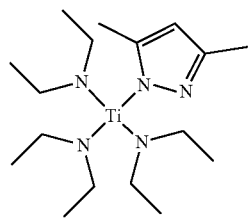
(1-97)

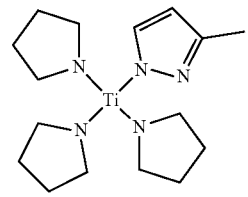
(1-98)

may be mentioned. Among them, preferred are titanium complexes (1-1), (1-2), (1-6) to (1-8), (1-10), (1-19), (1-20), (1-24) to (1-26), (1-28), (1-37), (1-38), (1-42) to (1-44), (1-46), (1-55), (1-56), (1-60) to (1-62), (1-64), (1-66), (1-67), (1-71) to (1-73), (1-75), (1-77), (1-80) and (1-88), and more preferred are titanium complexes (1-1), (1-2), (1-6), (1-8), (1-19), (1-20), (1-24), (1-26), (1-37), (1-3) 42) and (1-44) because they have adequate vapor pressures and thermal stability as CVD or ALD precursors.

Next, the method for producing the titanium complex (1) of the present invention will be described.

The titanium complex (1) may be produced by the following method 1.

The method 1 of the present invention is a method for producing the titanium complex (1) which comprises reacting an amide complex represented by the general formula (2) (hereinafter referred to as an amide complex (2)) with an unsaturated cyclic amine represented by the general formula (3) (hereinafter referred to as an unsaturated cyclic amine (3)).

Method 1

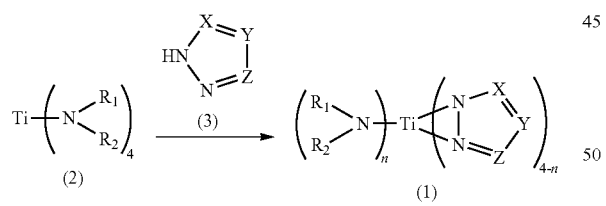

(wherein $R_1$, $R_2$, X, Y, Z and n are the same as previously defined.)

Examples of the amide complex (2) used in the method 1 of the present invention are:

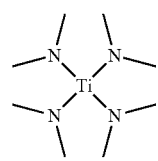
(2-1)

-continued

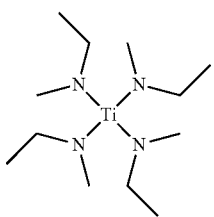
(2-2)

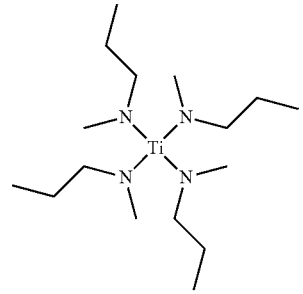
(2-3)

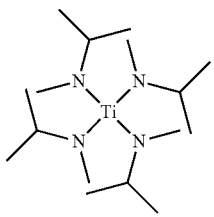
(2-4)

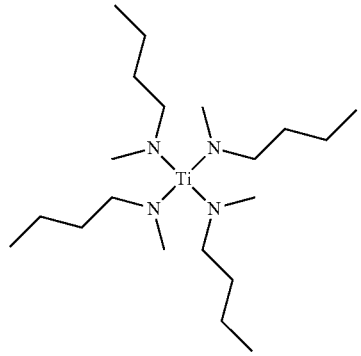
(2-5)

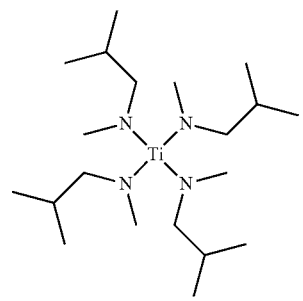
(2-6)

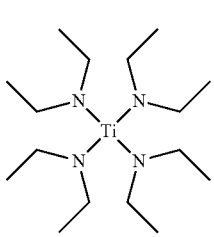
(2-7)

(2-8)
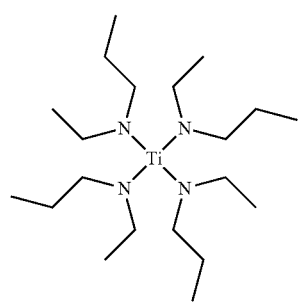

(2-9)
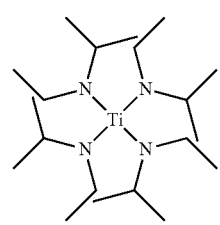

(2-10)
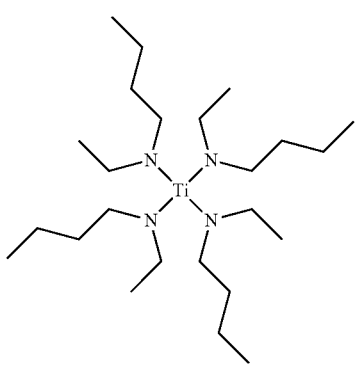

(2-11)
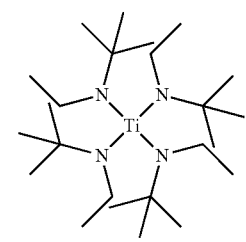

(2-12)
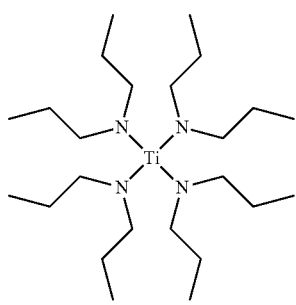

(2-13)
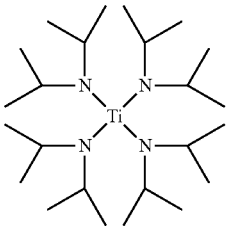

(2-14)
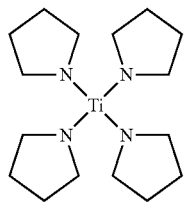

(2-15)
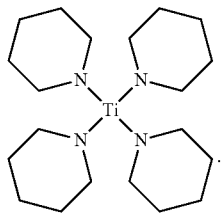

Preferred are amide complexes (2-1), (2-2), (2-7), (2-14) and (2-15), and more preferred are amide complexes (2-1), (2-2) and (2-7), to obtain the titanium complex (1) of the present invention in a high yield.

The amide complex (2) used in the method 1 of the present invention may be purchased or may be obtained in accordance with European Polymer Journal, vol. 7, p. 289 (1971), Organometallics, vol. 24, p. 5383 (2005), Journal of the Chemical Society, p. 3857 (1960) and so on.

Examples of the unsaturated cyclic amine (3) used in the method 1 of the present invention are:

(3-1)

(3-2)
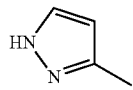

(3-3)
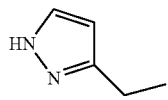

(3-4)
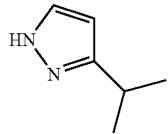

(3-5)
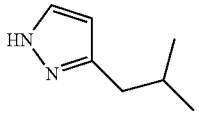

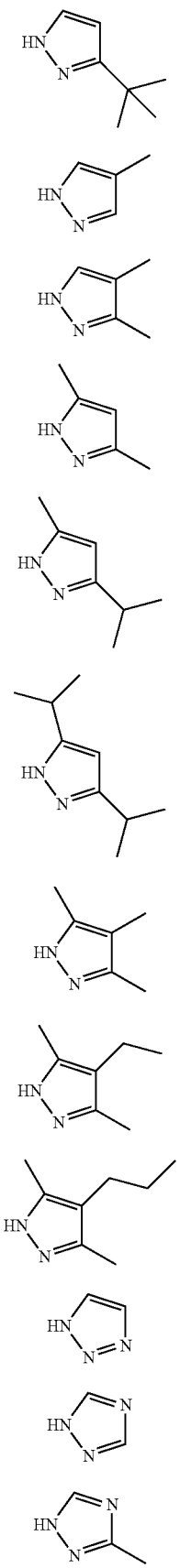
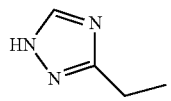
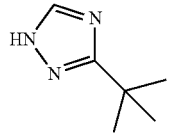

Preferred are unsaturated cyclic amines (3-1), (3-2), (3-7) to (3-9) and (3-12), and more preferred are unsaturated cyclic amines (3-1), (3-2), (3-7) and (3-9), to obtain the titanium complex (1) of the present invention in a high yield.

The unsaturated cyclic amine (3) used in the method 1 of the present invention may be purchased or may be obtained in accordance with CN106316956A, Bulletin of the Chemical Society of Japan, vol. 64, p. 719 (1991) and so on.

The molar ratio of the amide complex (2) to the unsaturated cyclic amine (3) in the method 1 of the present invention will be described. When n in the formula (1) is 1, the amount of the unsaturated cyclic amine (3) is preferably from 2.5 to 3.5 molar equivalents, more preferably from 2.9 to 3.1 molar equivalents per 1 molar equivalent of the amide complex (2), to obtain the titanium complex (1) of the present invention in a high yield. When n in the formula (1) is 2, the amount of the unsaturated cyclic amine (3) is preferably from 1.5 to 2.5 molar equivalents, more preferably from 1.9 to 2.1 molar equivalents per 1 molar equivalent of the amide complex (2), to obtain the titanium complex (1) of the present invention in a high yield. When n in the formula (1) is 3, the amount of the unsaturated cyclic amine (3) is preferably from 0.8 to 1.5 molar equivalents, more preferably from 0.9 to 1.1 molar equivalents per 1 molar equivalent of the amide complex (2), to obtain the titanium complex (1) of the present invention in a high yield.

The method 1 of the present invention is carried out preferably in an inert gas atmosphere, to obtain the titanium complex (1) of the present invention in a high yield. Specific examples of the inert gas include helium, neon, argon, krypton, xenon and nitrogen gas. Nitrogen gas or argon is preferred because they are available at low prices.

The method 1 of the present invention is preferably carried out in an organic solvent, to obtain the titanium complex (1) of the present invention in a high yield. Any organic solvent that does not inhibit the reaction may be used without particular restrictions. As examples of the organic solvent to be used, aliphatic hydrocarbons such as pentane, hexane, heptane, octane, cyclohexane, methylcyclohexane, ethylcyclohexane and petroleum ether, aromatic hydrocarbons such as benzene, toluene, xylene, ethylbenzene, propylbenzene, isopropylbenzene, butylbenzene, 2-methylpropylbenzene, 1-methylpropylbenzene, tert-butylbenzene and 1,3,5-trimethylbenzene (mesitylene) and ethers such as diethyl ether, diisopropyl ether, dibutyl ether, cyclopentyl methyl ether (CPME), cyclopentyl ethyl ether (CPEE), tert-butyl methyl ether (MTBE), THF, dioxane and 1,2-dimethoxyethane may be mentioned. These organic solvents may be used singly or in combinations of two or more at any ratio. The organic solvent is preferably hexane, heptane, toluene or an ether, more preferably hexane, to obtain the titanium complex (1) of the present invention in a high yield.

There are no particular restrictions on the reaction temperature and the reaction time for the method 1 of the present invention, and conditions usually used by a person skilled in the art for production of organic metal complexes may be used. Specifically speaking, appropriate choice of reaction temperature from the range of from −80° C. to 120° C., and appropriate choice of reaction time from the range of from 10 minutes to 120 hours allow high yield production of the titanium complex (1) of the present invention.

The titanium complex (1) of the present invention produced by the method 1 of the present invention may be purified by purification techniques appropriately chosen from those usually used by a person skilled in the art for purification of organic metal complexes such as filtration, extraction, ultracentrifugation, decantation, distillation, sublimation and crystallization.

Now, the method for producing a titanium-containing thin film which is characterized in that the titanium complex (1) of the present invention is used in vapor deposition involving a chemical reaction will be described in detail. Herein, the vapor deposition involving a chemical reaction refers to a technique for depositing a titanium-containing thin film by decomposing a vaporized titanium complex (1) on the substrate, specifically speaking, a CVD process such as thermal CVD, plasma-enhanced CVD or photo-initiated CVD, or an ALD process. CVD is particularly preferred in view of fast film growth, and ALD is particularly preferred in view of good step coverage. For example, in production of a titanium-containing thin film by CVD or ALD, a titanium complex (1) is fed to the reaction chamber in gaseous form and decomposed on a substrate placed in the reaction chamber to deposit a titanium-containing thin film on the substrate. Decomposition of the titanium complex (1) may be induced by techniques usually used by a person skilled in the art for formation of metal-containing thin films, for example, through reactions with a reactant gas or by exposure to heat, plasma or light.

The reactant gas, if used, may, for example, be a reductive gas or an oxidative gas. The reactant gas is preferably a reductive gas because it does not damage the substrate during film growth when the substrate is made of a material with poor oxidation resistance such as metals and metal nitrides. As specific examples of the reactant gas, ammonia, hydrogen, monosilane, hydrazine, formic acid, borane-amine complexes such as borane-dimethylamine complex or borane-trimethylamine complex, acyclic hydrocarbons such as 1-butene, 2-butene, 2-methylpropene, 1-pentene, 2-pentene, 2-methyl-1-butene, 2-methyl-2-butene, 3-methyl-1-butene, 1-hexene, 2-hexene, 3-hexene, 2-methyl-1-pentene, 2-methyl-2-pentene, 4-methyl-2-pentene, 4-methyl-1-pentene, 3-methyl-1-pentene, 3-methyl-2-pentene, 2-ethyl-1-butene, 2,3-dimethyl-1-butene, 2,3-dimethyl-2-butene, 3,3-dimethyl-1-butene, buta-1,3-diene, penta-1,3-diene, penta-1,4-diene, 2-methylbuta-1,3-diene, hexa-1,3-diene, hexa-2,4-diene, 2-methylpenta-1,3-diene, 3-methylpenta-1,3-diene, 4-methylpenta-1,3-diene, 2-ethylbuta-1,3-diene, 3-methylpenta-1,4-diene or 2,3-dimethylbuta-1,3-diene, and cyclic hydrocarbons such as cyclohexa-1,3-diene, cyclohexa-1,4-diene, 1-methylcyclohexa-1,3-diene, 2-methylcyclohexa-1,3-diene, 5-methylcyclohexa-1,3-diene, 3-methylcyclohexa-1,4-diene, α-phellandrene, β-phellandrene, α-terpinen, β-terpinen, γ-terpinene or limonene may be mentioned. More than one reactant gas may be used at the same time. As the reactant gas, ammonia, hydrogen, formic acid, cyclohexa-1,3-diene, cyclohexa-1,4-diene, α-terpinen, β-terpinen, γ-terpinene and limonene are preferred because they can be handled easily with little restriction on the deposition system. Ammonia is preferably used when titanium nitride tin films are formed as described later. The flow volume of a reactant gas is adjusted appropriately in accordance with the reactivity of the precursor and the volume of the reaction chamber. For example, when the reaction chamber has a volume of 1 to 10 L, the flow volume of the reactant gas is preferably from 1 to 10,000 sccm from an economic viewpoint, although there are no particular restrictions. Herein, sccm is the unit of a flow volume of a gas, and 1 sccm corresponds to a flow of a gas at a rate of 2.68 mmol/h in terms of the ideal gas.

In production of a titanium-containing thin film by CVD or ALD, an appropriate decomposition technique is chosen from those mentioned above to ensure deposition of a titanium-containing thin film. More than one decomposition techniques may be used in combination. To supply the titanium complex (1) to the reaction chamber, systems usually used by a person skilled in the art such as the bubbler system which involves vaporization of the titanium complex (1) by bubbling a carrier gas through the titanium complex (1) in a hot thermostatic bath and the liquid material vaporization supply systems may be used without any particular restrictions. A diluent gas may be introduced together to the reaction chamber, if necessary.

As the carrier gas and the diluent gas used to produce titanium-containing thin films by CVD or ALD, a noble gas such as helium, neon, argon, krypton or xenon or nitrogen gas is preferred, and nitrogen gas or argon is more preferred from an economic viewpoint. The flow volume of the carrier gas and the diluent gas is appropriately adjusted in accordance with the volume of the reaction chamber and the like. For example, when the reaction chamber has a volume of 1 to 10 L, the flow volume of the charrier gas is preferably from 1 to 10,000 sccm from an economic viewpoint, although there are no particular restrictions.

The substrate temperature during deposition of a titanium-containing thin film by CVD or ALD is appropriately chosen in accordance with the use of heat, plasma or light and the type of the reactant gas and the like. For example, when ammonia is used as the reactant gas without use of light or plasma, the substrate temperature is preferably from 50° C. to 1,0000° C. from an economic viewpoint, although there are no particular restrictions. Temperatures between 100° C. and 300° C. are preferred for fast film growth, and temperatures between 150° C. and 250° C. are more preferred for formation of a conformal thin film with good continuity. Use of light, plasma or hydrazine allows deposition of titanium-containing thin films at lower temperatures.

Titanium-containing thin films are deposited by CVD or ALD preferably at reduced pressures, particularly at from 1 to 100 Torr, more preferably at from 1 to 10 Torr in view of the conformality, step coverage and quality of films.

The method of the present invention for producing a titanium-containing thin film can provide titanium-containing thin films such as metal titanium thin films, titanium nitride thin films, silicon-containing titanium nitride thin films and titanium silicide thin films. Deposition of a metal titanium thin film may be followed by continued heating of the substrate at appropriate temperatures to form a titanium-containing composite film. For example, titanium-containing composite films are obtained when other metal materials are combined. For example, titanium silicide thin films are obtained by combined use of the titanium complex (1) of the present invention and a silicon source such as monosilane, disilane, trisilane, tetraethoxysilane, dimethyldimethoxysilane, bis(tert-butylamino)silane, bis(diethylamino)silane and tris(dimethylamino)silane. When a metal material containing a main group metal such as aluminum or germanium, a transitional metal such as hafnium, niobium, tantalum or tungsten, or a rare earth metal such as lanthanum or neodymium is used in combination with the titanium complex (1) of the present invention, a titanium-containing composite film containing such a metal element can be obtained. When a titanium-containing composite thin film is produced by CVD or ALD, the titanium complex (1) of the present invention and the other metal material may be fed to the reaction chamber separately or as a mixture.

When used as a component of a semiconductor device, the titanium-containing thin film of the present invention can provide a high performance semiconductor device such as DRAM, FeRAM, PRAM, MRAM, ReRAM, flash memories and other semiconductor memories and field-effect transistors with better reliability and response. As the component of these semiconductor devices, a capacitor electrode, a transistor gate electrode, a barrier layer for copper interconnects and the like may be mentioned.

EXAMPLES

Now, the present invention will be described in further detail with reference to Examples. However, it should be understood that the present invention is by no means restricted thereto. All the syntheses of compounds in Reference Examples 1 to 4 and Examples 1 to 13 were conducted under an argon atmosphere. Hexane and tetrahydrofuran (THF) were purchased from KANTO CHEMICAL CO., INC. as dehydrated grade. Diethylamine, ethylmethylamine and pyrrolidine were purchased from TOKYO CHEMICAL INDUSTRY CO., LTD., and dietylamine was purchased from FUJIFILM Wako Pure Chemical Corporation.

Reference Example 1

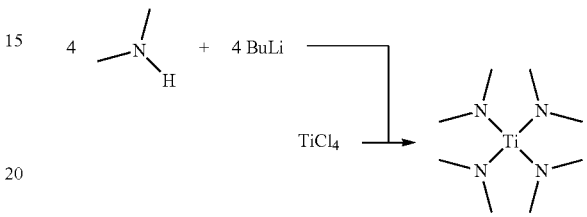

245 mL of a hexane solution of butyllithium (1.59 mol/L, 389.6 mmol) was added to 200.0 mL of a THE solution of dimethylamine (2.00 mol/L, 400.0 mmol) at −78° C. The resulting mixture was stirred at 25° C. for 1 hour, and 17.3 g (91.2 mmol) of titanium tetrachloride in hexane (50 mL) was added at −78° C. The resulting mixture was stirred at 25° C. for 18 hours. The resulting suspension was filtered, and the solvent was distilled off from the filtrate under reduced pressure. The residual liquid was distilled (heating temperature 60° C./back pressure 49 Pa) to obtain 15.7 g of tetrakis(dimethylamido)titanium (2-1) as a yellow liquid in a 77% yield. $^1$H-NMR (400 MHz, $C_6D_6$, δ): 3.11 (s, 24H).

Reference Example 2

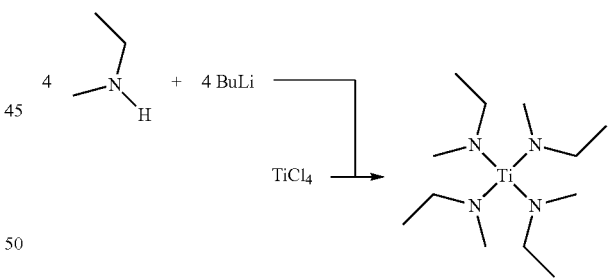

266.0 mL of a hexane solution of butyllithium (1.59 mol/L, 422.3 mmol) was added to 36.3 mL (422. 5 mmol) of ethylmethylamine in hexane (120 mL). The resulting mixture was stirred at 25° C. for 1 hour, and 19.0 g (100.2 mmol) of titanium tetrachloride in hexane (40 mL) was added. The resulting mixture was stirred at 25° C. for 18 hours. The resulting suspension was filtered, and the solvent was distilled off from the filtrate under reduced pressure. The residual liquid was distilled (heating temperature 90° C./back pressure 19 Pa) to obtain 22.4 g of tetrakis(ethylmethylamido)titanium (2-2) as an orange liquid in a 80% yield.

$^1$H-NMR (400 MHz, $C_6D_6$, δ): 3.47 (q, 8H), 3.13 (s, 12H), 1.12 (t, 12H).

Reference Example 3

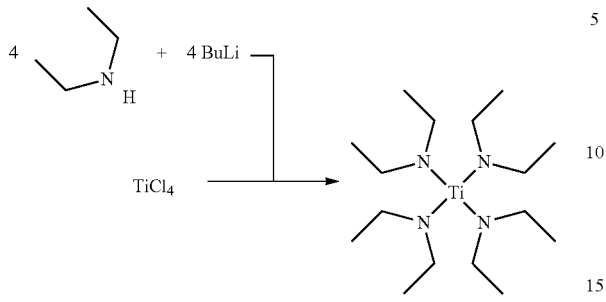

266.0 mL of a hexane solution of butyllithium (1.59 mol/L, 422.3 mmol) was added to 43.7 mL (422.7 mmol) of diethylamine in hexane (120 mL) at −78° C. The resulting mixture was stirred at 25° C. for 1 hour, and 19.0 g (100.2 mmol) of titanium tetrachloride in hexane (40 mL) was added at −78° C. The resulting mixture was stirred at 25° C. for 18 hours. The resulting suspension was filtered, and the solvent was distilled off from the filtrate under reduced pressure. The residual liquid was distilled (heating temperature 120° C./back pressure 42 Pa) to obtain 18.9 g of tetrakis(diethylamido)titanium (2-7) as a red liquid in a 56% yield.

$^1$H-NMR (400 MHz, $C_6D_6$, δ): 3.59 (q, 16H), 1.12 (t, 24H).

Reference Example 4

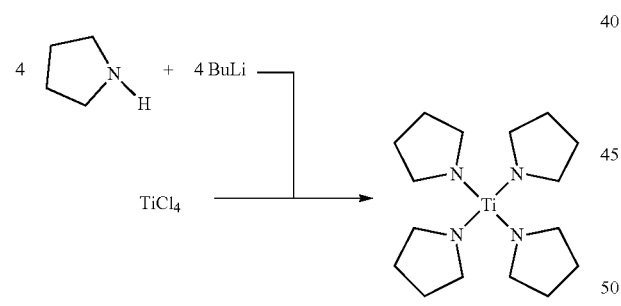

220.0 mL of a hexane solution of butyllithium (1.59 mol/L, 349.8 mmol) was added to 23.0 g (323.4 mmol) of pyrrolidine in hexane (50 mL) at −78° C. The resulting mixture was stirred at 25° C. for 1 hour and then added to 15.4 g (81.2 mmol) of titanium tetrachloride in hexane (25 mL) at −78° C. The resulting mixture was stirred at 25° C. for 18 hours. The resulting suspension was filtered, and the solvent was distilled off from the filtrate. The residual liquid was distilled (heating temperature 160° C./back pressure 68 Pa) to obtain 13.5 g of tetrakis(pyrrolidinato)titanium (2-14) as a yellow liquid in a 51% yield.

$^1$H-NMR (400 MHz, $C_6D_6$, δ): 3.79 (t, 16H), 1.56 (t, 16H).

Example 1

0.31 g (4.6 mmol) of pyrazole in THF (16 mL) was added to 1.0 g (4.5 mmol) of tetrakis(dimethylamido)titanium (2-1) synthesized in Reference Example 1 in THF (33 mL) at −78° C. The resulting solution was stirred at 25° C. for 1 hour, and the solvent was distilled off under reduced pressure. The residual solid was sublimated (heating temperature 100° C./back pressure 32 Pa) to obtain 0.4 g of tris(dimethylamido)(pyrazolato)titanium (1-1) as a red solid in a 36% yield.

$^1$H-NMR (400 MHz, $C_6D_6$, δ): 7.75 (d, 2H), 6.54 (t, 1H), 3.24 (s, 18H).

Example 2

0.46 g (5.7 mmol) of 3-methylpyrazole in THF (20 mL) was added to 1.3 g (5.8 mmol) of tetrakis(dimethylamido)titanium (2-1) synthesized in Reference Example 1 in THF (40 mL) at −78° C. The resulting solution was stirred at 25° C. for 1 hour, and the solvent was distilled off under reduced pressure. The residual liquid was distilled (heating temperature 80° C./back pressure 30 Pa) to obtain 0.4 g of tris(dimethylamido)(3-methylpyrazolato)titanium (1-2) as a red liquid in a 28% yield.

$^1$H-NMR (400 MHz, $C_6D_6$, δ): 7.68 (s, 1H), 6.33 (s, 1H), 3.26 (s, 18H), 2.30 (s, 3H).

Example 3

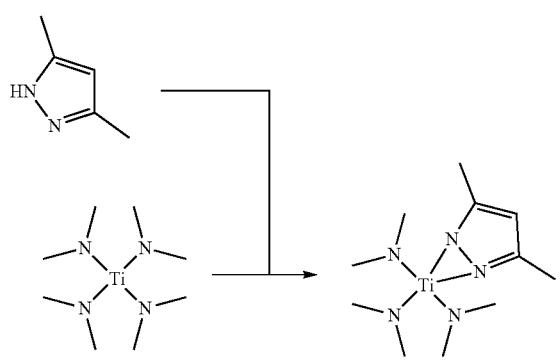

0.39 g (4.0 mmol) of 3,5-dimethylpyrazole in THF (15 mL) was added to 0.9 g (4.0 mmol) of tetrakis(dimethylamido)titanium (2-1) synthesized in Reference Example 1 in THF (30 mL) at −78° C. The resulting solution was stirred at 25° C. for 1 hour, and the solvent was distilled off under reduced pressure. The residual liquid was distilled (heating temperature 100° C./back pressure 25 Pa) to obtain 0.2 g of tris(dimethylamido)(3,5-dimethylpyrazolato)titanium (1-8) as a red liquid in a 21% yield.

$^{1}$H-NMR (400 MHz, $C_6D_6$, δ): 6.11 (s, 1H), 3.28 (s, 18H), 2.28 (s, 6H).

$^{13}$C-NMR (400 MHz, $C_6D_6$, δ): 146.58, 111.88, 46.24, 13.12.

Example 4

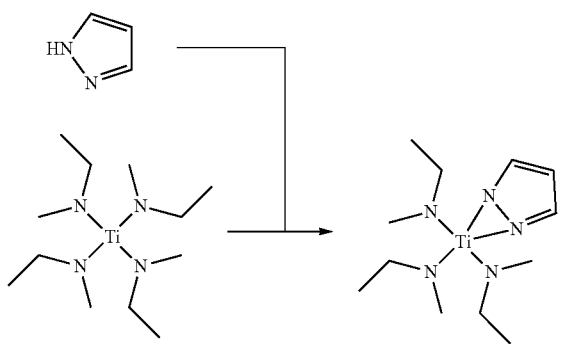

0.44 g (6.5 mmol) of pyrazole in THF (24 mL) was added to 1.8 g (6.4 mmol) of tetrakis(ethylmethylamido)titanium (2-2) in THF (47 mL) at −78° C. The resulting solution was stirred at 25° C. for 1 hour, and the solvent was distilled off under reduced pressure. The residual liquid was distilled (heating temperature 90° C./back pressure 19 Pa) to obtain 0.7 g of tris(ethylmethylamido)(pyrazolato)titanium (1-19) as a red liquid in a 37% yield.

$^{1}$H-NMR (400 MHz, $C_6D_6$, δ): 7.76 (d, 2H), 6.54 (t, 1H), 3.59 (q, 6H), 3.28 (s, 9H), 1.07 (t, 9H).

$^{13}$C-NMR (400 MHz, $C_6D_6$, δ): 135.82, 111.77, 53.05, 42.13, 15.16.

Example 5

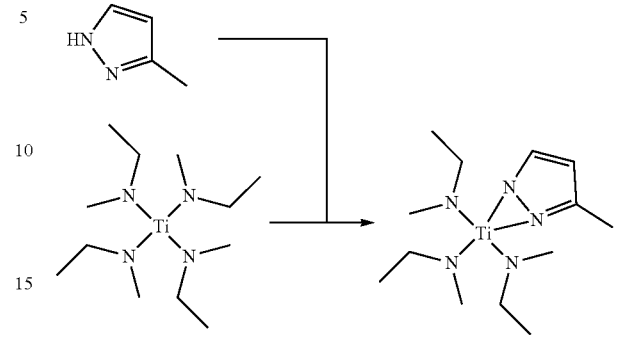

3.5 g (42.8 mmol) of 3-methylpyrazole in THF (90 mL) was added to 12.0 g (42.9 mmol) of tetrakis(ethylmethylamido)titanium (2-2) synthesized in Reference Example 2 in THF (190 mL) at −78° C. The resulting solution was stirred at 2500 for 1 hour, and the solvent was distilled off under reduced pressure. The residual liquid was distilled (heating temperature 103° C./back pressure 38 Pa) to obtain 9.6 g of tris(ethylmethylamido)(3-methylpyrazolato)titanium (1-20) as a red liquid in a 74% yield.

$^{1}$H-NMR (400 MHz, $C_6D_6$, δ): 7.69 (d, 1H), 6.33 (d, 1H), 3.62 (q, 6H), 3.30 (s, 9H), 2.31 (s, 3H), 1.08 (t, 9H).

$^{13}$C-NMR (400 MHz, $C_6D_6$, δ): 145.86, 136.52, 111.67, 53.14, 42.20, 15.23, 12.90.

Example 6

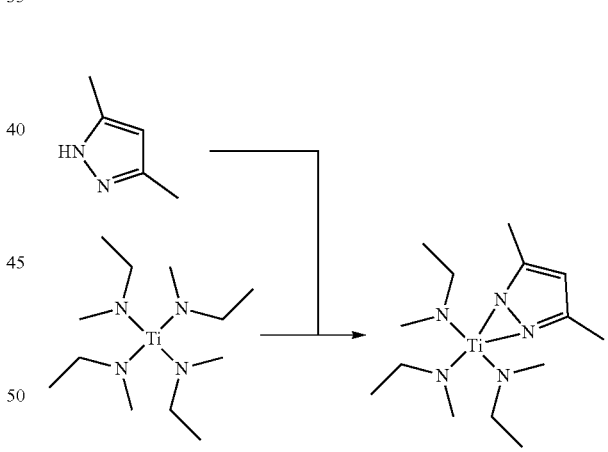

0.71 g (7.4 mmol) of 3,5-dimethylpyrazole in THF (27 mL) was added to 2.1 g (7.5 mmol) of tetrakis(ethylmethylamido)titanium (2-2) synthesized in Reference Example 2 in THF (54 mL) at −78° C. The resulting solution was stirred at 25° C. for 1 hour, and the solvent was distilled off under reduced pressure. The residual liquid was distilled (heating temperature 110° C./back pressure 18 Pa) to obtain 1.2 g of tris(ethylmethylamido)(3,5-dimethylpyrazolato)titanium (1-26) as a red liquid in a 51% yield.

$^{1}$H-NMR (400 MHz, $C_6D_6$, δ): 6.12 (s, 1H), 3.64 (q, 6H), 3.32 (s, 9H), 2.30 (s, 6H), 1.10 (t, 9H).

$^{13}$C-NMR (400 MHz, $C_6D_6$, δ): 146.43, 111.62, 53.22, 42.27, 15.30, 13.07.

Example 7

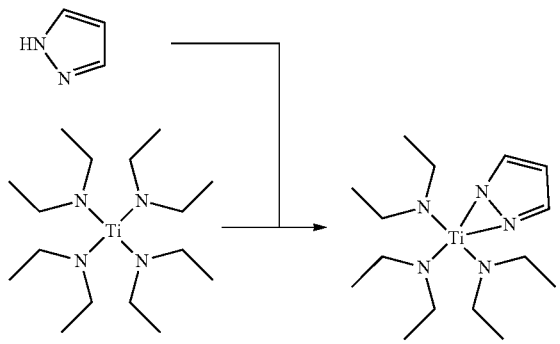

1.00 g (14.7 mmol) of pyrazole in THF (54 mL) was added to 4.9 g (14.6 mmol) of tetrakis(diethylamido)titanium (2-7) synthesized in Reference Example 3 in THF (108 mL) at −78° C. The resulting solution was stirred at 25° C. for 1 hour, and the solvent was distilled off under reduced pressure. The residual liquid was distilled (heating temperature 120° C./back pressure 20 Pa) to obtain 3.2 g of tris(diethylamido)(pyrazolato)titanium (1-37) as a red liquid in a 66% yield.

$^1$H-NMR (400 MHz, $C_6D_6$, δ): 7.76 (d, 2H), 6.55 (t, 1H), 3.69 (q, 12H), 1.07 (t, 18H).

$^{13}$C-NMR (400 MHz, $C_6D_6$, δ): 135.84, 111.45, 47.82, 15.49.

Example 8

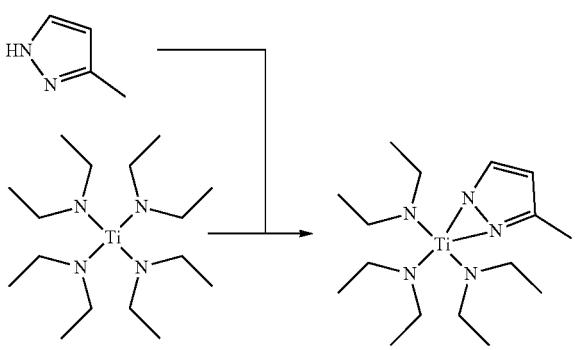

0.23 g (2.8 mmol) of 3-methylpyrazole in THF (10 mL) was added to 0.9 g (2.8 mmol) of tetrakis(diethylamido)titanium (2-7) synthesized in Reference Example 3 in THF (20 mL) at −78° C. The resulting solution was stirred at 25° C. for 1 hour, and the solvent was distilled off under reduced pressure. The residual liquid was distilled (heating temperature 120° C./back pressure 38 Pa) to obtain 0.3 g of tris(diethylamido)(3-methylpyrazolato)titanium (1-38) as a red liquid in a 33% yield.

$^1$H-NMR (400 MHz, $C_6D_6$, δ): 7.69 (d, 1H), 6.33 (d, 1H), 3.71 (q, 12H), 2.32 (s, 3H), 1.08 (t, 18H).

Example 9

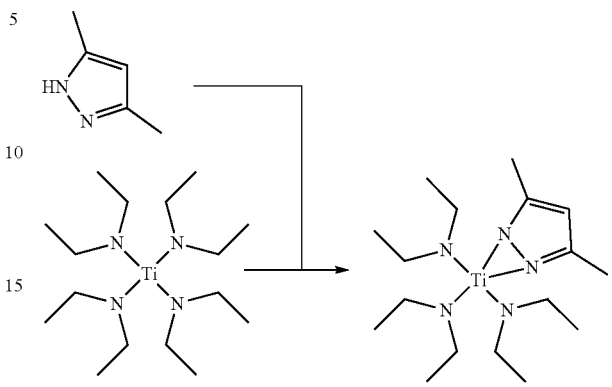

0.47 g (4.9 mmol) of 3,5-dimethylpyrazole in THF (18 mL) was added to 1.7 g (5.0 mmol) of tetrakis(diethylamido)titanium (2-7) synthesized in Reference Example 3 in THF (36 mL) at −78° C. The resulting solution was stirred at 25° C. for 1 hour, and the solvent was distilled off under reduced pressure. The residual liquid was distilled (heating temperature 130° C./back pressure 22 Pa) to obtain 0.7 g of tris(diethylamido)(3,5-dimethylpyrazolato)titanium (1-44) as a red liquid in a 40% yield.

$^1$H-NMR (400 MHz, $C_6D_6$, δ): 6.12 (s, 1H), 3.74 (q, 12H), 2.31 (s, 6H), 1.10 (t, 18H).

$^{13}$C-NMR (400 MHz, $C_6D_6$, δ): 146.29, 111.37, 48.01, 15.61, 13.03.

Example 10

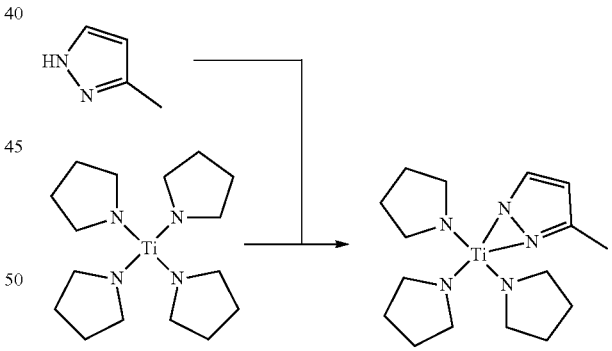

0.32 g (3.9 mmol) of 3-methylpyrazole in THF (10 mL) was added to 1.3 g (4.0 mmol) of tetrakis(pyrrolidinato)titanium (2-14) synthesized in Reference Example 4 in THF (20 mL) at −78° C. The resulting solution was stirred at 25° C. for 1 hour, and the solvent was distilled off under reduced pressure. The residual liquid was distilled (heating temperature 114° C./back pressure 28 Pa) to obtain 0.3 g of tris(pyrrolidinato)(3-methylpyrazolato)titanium (1-56) as a red liquid in a 24% yield.

$^1$H-NMR (400 MHz, $C_6D_6$, δ): 7.74 (d, 1H), 6.38 (d, 1H), 4.00 (t, 12H), 2.34 (s, 3H), 1.53 (t, 12H).

Example 11

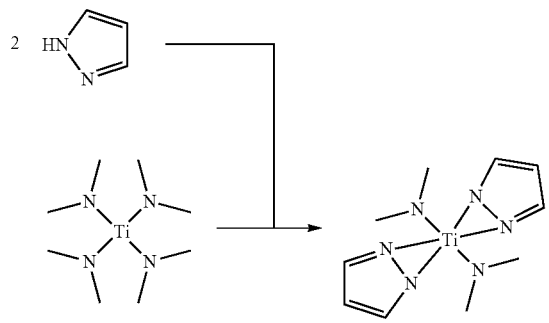

0.63 g (9.2 mmol) of pyrazole in THF (35 mL) was added to 1.0 g (4.6 mmol) of tetrakis(dimethylamido)titanium (2-1) synthesized in Reference Example 1 in THF (35 mL) at −78° C. The resulting solution was stirred at 25° C. for 1 hour, and the solvent was distilled off under reduced pressure to obtain bis(dimethylamido)bis(pyrazolato)titanium (1-77) as a dark red liquid in a 48% yield.

$^1$H-NMR (400 MHz, $C_6D_6$, δ): 7.81 (d, 4H), 6.59 (t, 2H), 3.28 (s, 12H)

Example 12

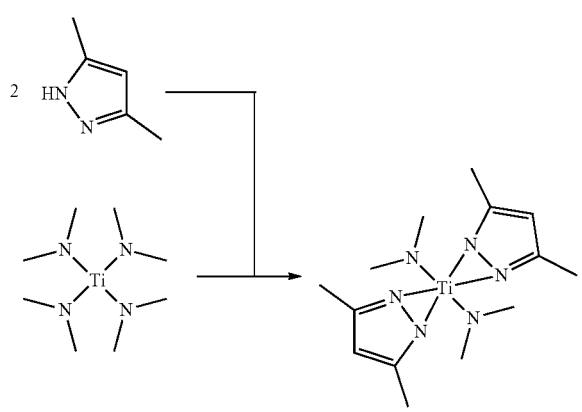

0.79 g (8.2 mmol) of 3,5-dimethylpyrazole in THF (30 mL) was added to 0.9 g (4.0 mmol) of tetrakis(dimethylamido)titanium (2-1) synthesized in Reference Example 1 in THE (30 mL) at −78° C. The resulting solution was stirred at 25° C. for 1 hour, and the solvent was distilled off under reduced pressure to obtain bis(dimethylamido)bis(3,5-dimethylpyrazolato)titanium (1-80) as a dark red liquid in a 51% yield.

$^1$H-NMR (400 MHz, $C_6D_6$, δ): 6.09 (s, 2H), 3.47 (s, 12H), 2.23 (s, 12H)

Example 13

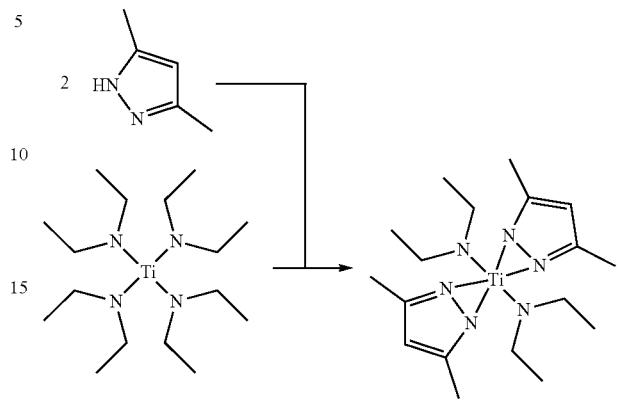

0.62 g (6.45 mmol) of 3,5-dimethylpyrazole in THF (25 mL) was added to 1.1 g (3.3 mmol) of tetrakis(diethylamido)titanium (2-7) synthesized in Reference Example 3 in THF (25 mL) at −78° C. The resulting solution was stirred at 25° C. for 1 hour, and the solvent was distilled off under reduced pressure to obtain bis(diethylamido)bis(3,5-dimethylpyrazolato)titanium (1-88) as a dark red liquid in a 56% yield.

$^1$H-NMR (400 MHz, $C_6D_6$, δ): 6.10 (s, 2H), 3.89 (q, 8H), 2.25 (s, 12H), 0.99 (t, 12H).

Evaluation Example 1

Thermal Analysis of tris(dimethylamido)(3,5-dimethylpyrazolato)titanium (1-8)

Differential scanning calorimetry (DSC) analysis was performed using a 8.3 mg sample of tris(dimethylamido)(3,5-dimethylpyrazolato)titanium (1-8) synthesized in Example 3.

The results of the DSC measurement at a heating rate of 10° C./min in an argon atmosphere in a sealed vessel shown in FIG. 1 indicates that the decomposition onset temperature was 152° C.

Evaluation Example 2

Thermal Analysis of tris(ethylmethylamido)(3-methylpyrazolato)titanium (1-20)

Differential scanning calorimetry (DSC) analysis was performed using a 5.8 mg sample of tris(ethylmethylamido)(3-methylpyrazolato)titanium (1-20) synthesized in Example 5.

Figure 2:
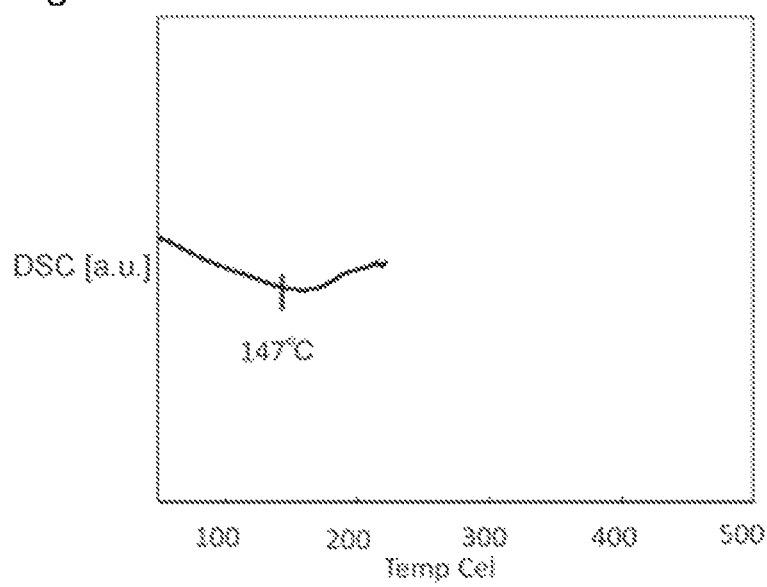
FIG. 2 A DSC chart of tris(ethylmethylamido)(3-methylpyrazolato)titanium (1-20) in Evaluation Example 2.

The results of the DSC measurement at a heating rate of 10° C./min in an argon atmosphere in a sealed vessel shown in FIG. 2 indicates that the decomposition onset temperature was 147° C.

Comparative Example 1

Thermal Analysis of tetrakis(dimethylamido)titanium

In Comparative Example 1, DSC analysis was performed using a 2.5 mg sample of tetrakis(dimethylamido)titanium (2-1) synthesized in Reference Example 1, which is not a titanium complex (1) of the present invention.

Figure 3:
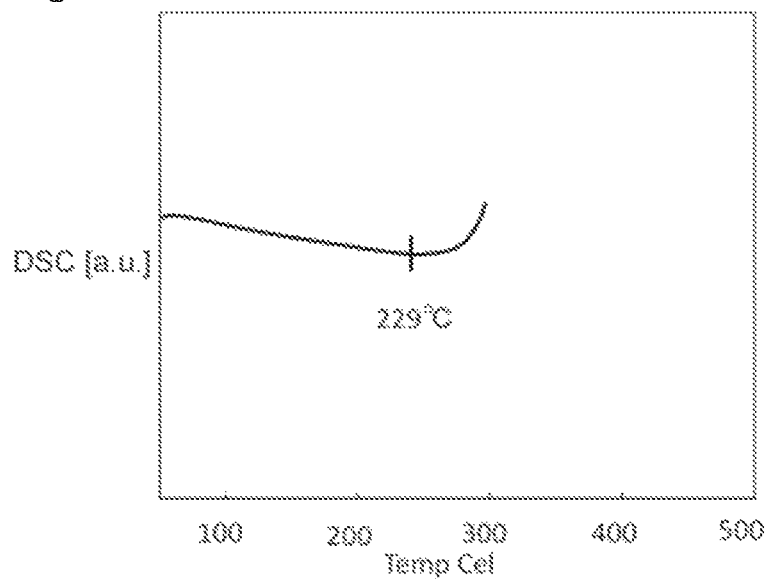
FIG. 3 A DSC chart of tetrakis(dimethylamido)titanium in Comparative Example 1.

The results of the DSC measurement at a heating rate of 10° C./min in an argon atmosphere in a sealed vessel shown in FIG. 3 indicates that the decomposition onset temperature was 229° C.

Comparative Example 2

Thermal Analysis of tetrakis(ethylmethylamido)titanium

In Comparative Example 2, DSC analysis was performed using a 4.4 mg sample of tetrakis(ethylmethylamido)titanium (2-2) synthesized in Reference Example 2, which is not a titanium complex (1) of the present invention.

Figure 4:
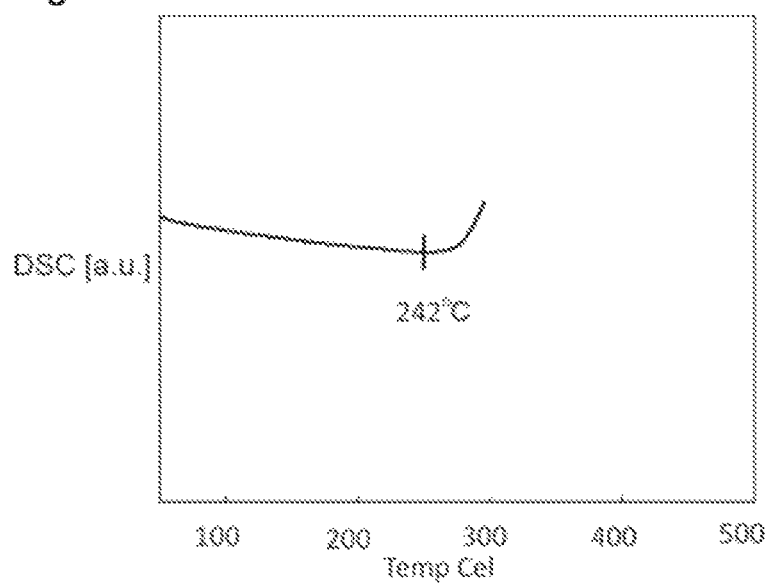
FIG. 4 A DSC chart of tetrakis(ethylmethylamido)titanium in Comparative Example 2.

The results of the DSC measurement at a heating rate of 10° C./min in an argon atmosphere in a sealed vessel shown in FIG. 4 indicates that the decomposition onset temperature was 242° C.

Comparative Example 3

Thermal Analysis of tetrakis(diethylamido)titanium

In Comparative Example 3, DSC analysis was performed using a 3.0 mg sample of tetrakis(diethylamido)titanium (2-7) synthesized in Reference Example 3, which is not a titanium complex (1) of the present invention.

Figure 5:
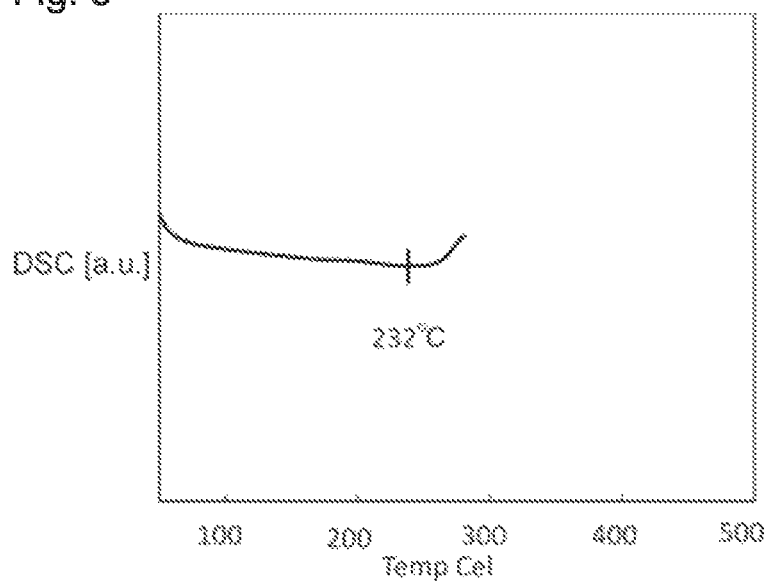
FIG. 5 A DSC chart of tetrakis(diethylamido)titanium in Comparative Example 3.

The results of the DSC measurement at a heating rate of 10° C./min in an argon atmosphere in a sealed vessel shown in FIG. 5 indicates that the decomposition onset temperature was 232° C.

The results in Evaluation Examples 1 and 2 and Comparative Examples 1 to 3 demonstrate that the titanium complexes (1) of the present invention have lower decomposition onset temperatures than tetrakis(dimethylamido)titanium, tetrakis(diethylamido)titanium and tetrakis(ethylmethylamido)titanium and are more suited for film deposition at low temperatures.

Example 14

Figure 6:
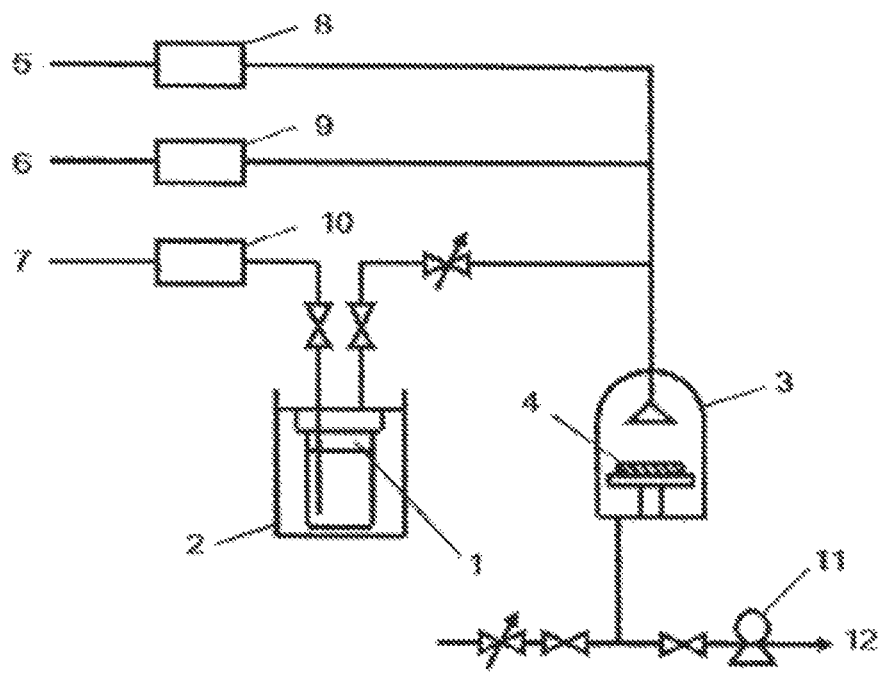
FIG. 6 A schematic view of the CVD system used in Example 14 and Comparative Example 4.

A titanium-containing thin film was produced by thermal CVD using tris(ethylmethylamido)(3-methylpyrazolato)titanium (1-20) synthesized in Example 5 as the precursor. FIG. 6 is a schematic view of the system used for the film production. The following conditions were used for the film production.

Carrier gas flow volume: 20 sccm, ammonia flow volume: 40 sccm, diluent gas flow volume: 140 sccm, substrate: $SiO_2$, deposition time: 60 minutes, total pressure in the reaction chamber: 1.3 kPa, precursor chamber temperature: 50° C., total pressure in the precursor chamber pressure: 6.7 kPa, precursor feed rate: 0.01 sccm, substrate temperature: 200° C. Argon was used as the carrier gas and the diluent gas. The X ray fluorescence spectrum of the thin film showed a characteristic X ray line attributed to titanium. The film thickness was estimated at 53 nm from the X ray spectrum intensity.

The results of Example 14 indicate that from the titanium complex (1) of the present invention, a titanium-containing film can be deposited at such a low temperature as 200° C. without using an oxidative gas or exposure to light or plasma.

Comparative Example 4

A titanium-containing thin film was produced by thermal CVD using tetrakis(dimethylamido)titanium (2-1) synthesized in Reference Example 1 as the precursor. FIG. 6 is a schematic view of the system used for the film production. The following conditions were used for the film production.

Carrier gas flow volume: 20 sccm, ammonia flow volume: 40 sccm, diluent gas flow volume: 140 sccm, substrate: $SiO_2$, deposition time: 60 minutes, total pressure in the reaction chamber: 1.3 kPa, precursor chamber temperature: 40° C., total pressure in the precursor chamber: 13.3 kPa, precursor feed rate: 0.064 sccm, substrate temperature: 200° C. Argon was used as the carrier gas and the diluent gas. The X ray fluorescence spectrum of the thin film showed a characteristic X ray line attributed to titanium. The film thickness was estimated at 36 nm from the X ray spectrum intensity.

The results of Example 14 and Comparative Example 4 indicate that a film can be deposited at a higher growth rate at 200° C. even at a lower precursor feed rate from the titanium complex (1) of the present invention, than from tetrakis(dimethylamido)titanium, and the titanium complex (1) of the present invention is suited for deposition of titanium-containing thin films at low temperatures.

The present invention has been described in detail with reference to specific embodiments. However, it is apparent to those skilled in the art that various changes and modifications are possible without departing from the nature and the scope of the present invention.

The entire disclosure of Japanese Patent Application No. 2020-117772 filed on Jul. 8, 2020 including specification, claims, drawings and summary is incorporated herein by reference in its entirety.

REFERENCE SYMBOLS

1 Precursor chamber
2 Thermostatic bath
3 Reaction chamber
4 Substrate
5 Reactant gas inlet
6 Diluent gas inlet
7 Carrier gas inlet
8 Mass flow controller
9 Mass flow controller
10 Mass flow controller
11 Oil-sealed rotary vacuum pump
12 Gas outlet

The invention claimed is:

1. A titanium complex represented by the general formula (1):

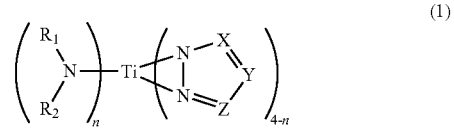

wherein each of $R_1$ and $R_2$ is independently a $C_{1-6}$ alkyl group which may be bonded with each other to form a ring, X is $CR_3$ or a N atom, Y is $CR_4$ or a N atom, Z is $CR_5$ or a N atom, each of $R_3$, $R_4$ and $R_5$ is independently a hydrogen atom or a $C_{1-6}$ alkyl group, and n is an integer of from 1 to 3.

2. The titanium complex according to claim 1, wherein each of $R_1$ and $R_2$ is independently a $C_{1-4}$ alkyl group, each of $R_3$, $R_4$ and $R_5$ is independently a hydrogen atom or a $C_{1-4}$ alkyl group, and n is 2 or 3.

3. The titanium complex according to claim 1, wherein each of $R_1$ and $R_2$ is independently a methyl group or an ethyl group, each of $R_3$, $R_4$ and $R_5$ is independently a hydrogen atom or a methyl group, and n is 3.

4. A method for producing the titanium complex as defined in claim 1, which comprises reacting an amide complex represented by the general formula (2):

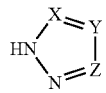
(2)

wherein each of $R_1$ and $R_2$ is independently a $C_{1-6}$ alkyl group which may be bonded with each other to form a ring, with an unsaturated cyclic amine represented by the general formula (3):

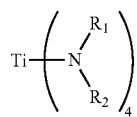
(3)

wherein X is $CR_3$ or a N atom, Y is $CR_4$ or a N atom, Z is $CR_5$ or a N atom, each of $R_3$, $R_4$ and $R_5$ is independently a hydrogen atom or a $C_{1-6}$ alkyl group.

5. A method for producing a titanium-containing thin film, which comprises depositing the titanium-containing thin film by decomposing a vaporized titanium complex represented by the general formula (1) on a substrate:

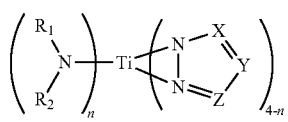
(1)

wherein each of $R_1$ and $R_2$ is independently a $C_{1-6}$ alkyl group which may be bonded with each other to form a ring, X is $CR_3$ or a N atom, Y is $CR_4$ or a N atom, Z is $CR_5$ or a N atom, each of $R_3$, $R_4$ and $R_5$ is independently a hydrogen atom or a $C_{1-6}$ alkyl group, and n is an integer of from 1 to 3.

6. The method according to claim 5, wherein depositing the titanium-containing thin film is chemical vapor deposition.

7. The method according to claim 5, wherein decomposing the vaporized titanium complex represented by the general formula (1) comprises reacting the vaporized titanium complex represented by the general formula (1) with a reactant gas.

8. The method according to claim 7, wherein the reactant gas is a reductive gas.

9. The method according to claim 5, wherein the titanium-containing thin film is a titanium nitride thin film.

* * * * *